United States Patent
Chandrasekaran et al.

(10) Patent No.: US 9,294,262 B2
(45) Date of Patent: *Mar. 22, 2016

(54) RECEIVER CLOCK TEST CIRCUITRY AND RELATED METHODS AND APPARATUSES

(71) Applicant: Rambus Inc., Sunnyvale, CA (US)

(72) Inventors: Srinivasaraman Chandrasekaran, Bangalore (IN); Kunal Desai, Karnataka (IN)

(73) Assignee: Rambus Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/722,995

(22) Filed: May 27, 2015

(65) Prior Publication Data

US 2015/0372804 A1    Dec. 24, 2015

Related U.S. Application Data

(63) Continuation of application No. 13/846,491, filed on Mar. 18, 2013, now Pat. No. 9,071,407.

(60) Provisional application No. 61/641,736, filed on May 2, 2012.

(51) Int. Cl.
   *H04B 3/46*     (2015.01)
   *H04L 7/00*     (2006.01)
   *H04L 1/20*     (2006.01)

(52) U.S. Cl.
   CPC .............. *H04L 7/0079* (2013.01); *H04L 1/205* (2013.01)

(58) Field of Classification Search
   None
   See application file for complete search history.

(56) References Cited

U.S. PATENT DOCUMENTS

| | | |
|---|---|---|
| 5,056,118 A | 10/1991 | Sun |
| 5,742,798 A | 4/1998 | Goldrian |
| 5,799,048 A | 8/1998 | Farjad-Rad et al. |
| 6,008,680 A | 12/1999 | Kyles |
| 6,044,123 A | 3/2000 | Takla |
| 6,075,416 A | 6/2000 | Dalmia |

(Continued)

FOREIGN PATENT DOCUMENTS

| | | |
|---|---|---|
| EP | 0987853 | 3/2000 |
| JP | 2000-035831 A2 | 2/2000 |

(Continued)

OTHER PUBLICATIONS

Agrawal et al., "An 8x3 Gb/s Parallel Receiver With Collaborative Timing Recovery," ISSCC 2008 Session 25, Building Blocks for High-Speed Transceivers, 2008 IEEE. 3 pages.

(Continued)

*Primary Examiner* — Adolf Dsouza

(57) ABSTRACT

An integrated circuit includes a plurality of receivers, each having a clock and data recovery circuit. A first local clock recovery circuit in a first receiver can be caused to produce a test clock which simulates a condition to be tested, and while a second receiver in the plurality of receivers that includes a second local clock recovery circuit is caused to use the test clock in place of the reference clock while receiving a test data sequence at its input. The clock and data recovery circuits in the receivers can include clock control loops responsive to loop control signals to modify the selected reference clock to generate the local clock in response to selective one of (i) a corresponding data signal for normal operation or during a test, and (ii) a test signal applied to the clock control loop in which case the test clock is produced.

20 Claims, 9 Drawing Sheets

(56) References Cited

U.S. PATENT DOCUMENTS

| | | |
|---|---|---|
| 6,307,906 B1 | 10/2001 | Tanji et al. |
| 6,509,773 B2 | 1/2003 | Buchwald et al. |
| 6,725,408 B1 | 4/2004 | Cao |
| 7,016,449 B2 | 3/2006 | Buchwald et al. |
| 7,058,150 B2 | 6/2006 | Buchwald et al. |
| 7,099,424 B1 | 8/2006 | Chang et al. |
| 7,251,764 B2 | 7/2007 | Bonneau et al. |
| 7,471,691 B2 | 12/2008 | Black et al. |
| 7,849,370 B2 | 12/2010 | Moshe et al. |
| 7,853,836 B2 | 12/2010 | Takada |
| 8,289,032 B2 | 10/2012 | Lee et al. |
| 2004/0250180 A1 | 12/2004 | Hotta |
| 2005/0271137 A1 | 12/2005 | Kolze et al. |
| 2007/0001661 A1* | 1/2007 | Loke et al. ............ H03L 7/0812 324/76.53 |
| 2007/0206670 A1 | 9/2007 | Aziz |
| 2007/0224958 A1* | 9/2007 | Nedachi ................. H04L 1/24 455/226.1 |
| 2008/0103719 A1* | 5/2008 | Seong ............ G01R 31/318552 702/125 |
| 2009/0290672 A1 | 11/2009 | Ho |
| 2010/0026314 A1 | 2/2010 | Schuttert |
| 2010/0090709 A1* | 4/2010 | Watanabe ............. G01R 29/26 324/555 |

FOREIGN PATENT DOCUMENTS

| | | |
|---|---|---|
| JP | 2003-005831 A2 | 2/2000 |
| WO | WO-00-70460 A1 | 11/2000 |
| WO | WO-2013-137863 A1 | 9/2013 |

OTHER PUBLICATIONS

Agrawal et al., "An 8X5 Gb/s Parallel Receiver With Collaborative Timing Recovery," IEEE Journal of Solid-State Circuits, vol. 44, No. 11, Nov. 2009. 11 pages.

Cypress Semiconductor Corporation, "Cypress Applications Handbook," Jan. 1996, pp. 6-26 to 6-33. 11 pages.

EP Official Communication dated Sep. 26, 2011 re EP Application No. 08157859.3. 5 pages.

PCT International Search Report and Written Opinion dated Nov. 30, 2012 in International Application No. PCT/US2012/028912. 8 pages.

Sidiropoulos et al., "A Semidigital Dual Delay-Locked Loop," IEEE Journal of Solid-State Circuits, vol. 32, No. 11, Nov. 1997, pp. 1683-1692. 10 pages.

Yee et al., "An Integratable 1-2.5Gbps Low Jitter CMOS Transceiver with Built in Self Test Capability," 1999 Symposium on VLSI Circuits Digest of Technical Papers, pp. 45-46. 2 pages.

* cited by examiner

CONTROL/STATUS REGISTERS

| |   |
|---|---|
| CDR MODE (k) | 201 |
| $f$ OFFSET (k) | 202 |
| $\Phi$ OFFSET (k) | 203 |
| LOCAL CLOCK SELECT (k) | 204 |
| PRE-FILTER ENABLE (k) | 205 |
| PRBS ENABLE (k) | 206 |
| PATTERN GENERATOR ENABLE (k) | 207 |
| CDR TEST RESULT (k) | 208 |

RECEIVER CLOCK TEST CIRCUITRY AND RELATED METHODS AND APPARATUSES

RELATED APPLICATIONS

This application is a continuation of U.S. Utility patent application Ser. No. 13/846,491, filed on 18 Mar. 2013, which in turn claims benefit of U.S. Provisional Patent Application No. 61/641,736 filed on 2 May 2012. The aforementioned utility patent application is hereby incorporated by reference.

TECHNICAL FIELD

The present invention relates generally to the field of electronic communications and more particularly to signaling between integrated circuit devices.

BACKGROUND

One type of digital data communication protocol utilizes data signals with an embedded clock on a single channel. In these protocols, the receiving circuit includes a clock and data recovery CDR circuit which produces a recovered clock, based typically on a local reference clock that has a frequency close to that of the transmit clock. The receiving circuit uses the recovered clock to sample the data on the channel. Phase differences between the recovered clock and the data signal can be detected and used as feedback in the generation of the recovered clock, so that it tracks the transmit clock on each channel as closely as possible.

One limitation on the data rate in communication channels is jitter tolerance. As the data rates increase, and the data sensing windows become smaller, the specifications for maximum allowed jitter for integrated circuits is becoming tighter. In CDR based systems, jitter can arise from a number of sources. For example, variations in the transmit clock due to transmit side circuits typically cause relatively low frequency jitter. Also, power supply noise-induced jitter on the receiver side typically includes higher frequency components. The dithering of the local clock caused by the CDR circuit itself is also a source of jitter. Also, frequency offsets in the data signals can prevent a CDR circuit from achieving a lock condition that can track the timing of the data signals.

During manufacturing, integrated circuits are tested for characteristics such as the data rate at which they can be used reliably in a variety of conditions. One of the conditions that is desirable to test, is tolerance of the receivers on the communication channels to variations in sample times, such as jitter and intentional frequency shifts such as those encountered in spread spectrum systems.

Unfortunately, this type of testing often requires high-precision test equipment to generate a test signal that mimics different jitter conditions. The generation of desired jitter conditions can be imprecise (especially at high signaling rates) and be limited by test equipment precision. In addition, the requirement for high-precision equipment renders it difficult to test manufactured devices outside of a test facility.

Thus, it is desirable to provide systems for determining whether the CDR circuits are able to achieve lock under conditions of stress caused by frequency offsets and various jitter conditions, and for measuring tolerance to different types of timing variations.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

In an integrated circuit including a plurality of receiver lanes, which include CDR circuits, the CDR circuit in one lane can be used to provide a test clock to the CDR circuit in a lane under test. The test clock in the CDR under test can be manipulated to simulate jitter and frequency offset conditions. For example, in some systems, adding frequency offset, jitter or both, to a test clock can be equivalent to adding jitter of an equal magnitude but opposite sign in a transmitted data signal. In this way, a test clock can be produced that simulates timing variations that can be encountered during mission function operation of the device under test, while test input data is applied by local pattern generators or other data sources that, under test conditions, do not, or need not, exhibit such variations.

Note that these techniques permit jitter to be mimicked by breaking a CDR feedback loop in a first lane, and by controlling timing generation by that CDR loop according to programmed parameters, e.g., by deliberately skewing "up/down" signals or other forms of CDR feedback. The local clock (generated for this first lane) in this manner is then provided to a second lane which substitutes this controllably-skewed clock in place of a reference clock used to generate a second lane recovered clock. Note that high-precision signal generation equipment is not required, that is, a relatively "clean" data signal can be provided to the second lane receiver, with the deliberately induced clock jitter mimicking the data signal jitter as indicated in the paragraph above. That is, testing can be performed using the CDR circuitry already on many receivers, using relatively straightforward circuit support or on-board test logic. By using CDR circuitry for another lane to induce jitter in a controlled manner, this technique permits very high precision jitter testing without conventional requirements of specialized test equipment. Testing can therefore be performed much more readily, by digital programming or control over a receiving device in connection with a test mode, and can if desired be performed in situ (e.g., at board assembly, at device manufacture, or at any point downstream of device manufacture).

To perform testing, steps that can be performed include:
1. Running a peer lane CDR circuit in open loop;
2. Manipulating the clock produced by the open loop peer lane CDR using programmed parameters to simulate sample timing variations (i.e., jitter and related conditions);
3. Using the resultant clock as input to another CDR corresponding to a lane under test;
4. Applying a test data sequence to the lane under test; and
5. Checking CDR lock and receiver sampler performance (e.g., based on bit error rate comparison relative to a known sequence).

Figure 1:
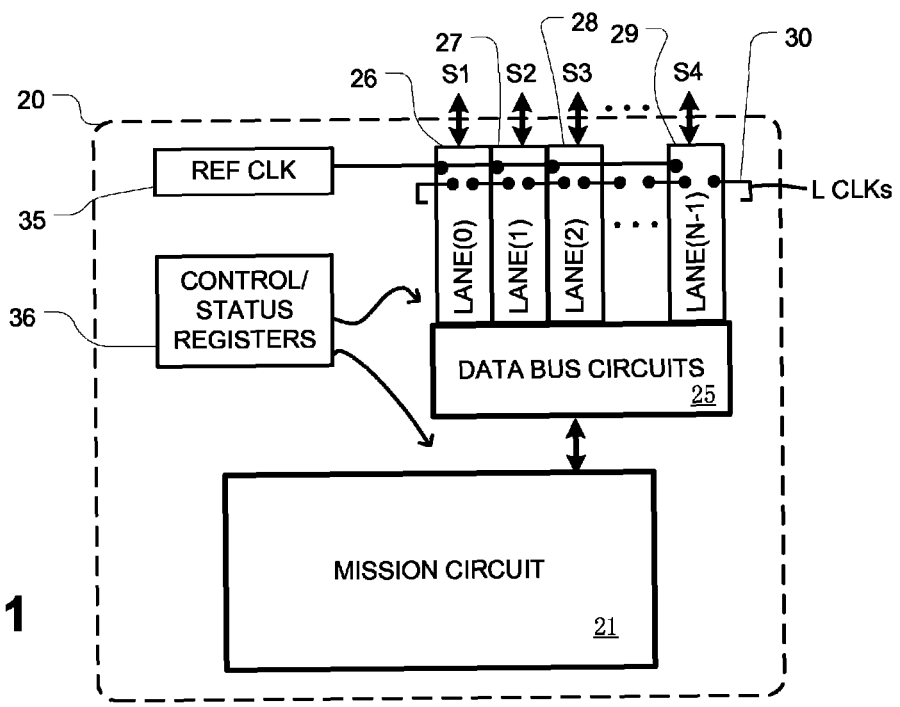
FIG. 1 is a simplified diagram of an integrated circuit including a plurality of clock and data recovery lanes as described herein.

FIG. 1 is a simplified block diagram of an integrated circuit 20. The integrated circuit in this example includes a mission circuit 21, such as a memory controller, a general purpose processor, an application specific circuit, a mixed analog/digital circuit, a logic circuit, a microprocessor, a programmable gate array, a system-on-a-chip (SOC) circuit, a memory, and so on, or any circuit which can be coupled with at least two data lanes as shown conceptually via data bus circuits 25. The lanes can be configured according to a variety of physical layer signaling protocols, including serial bus standards like PCI-Express Gen 2, or Optical Internetworking Forum (OIF) Common Electrical I/O (CEI) 6.

The data lanes, lane (0), lane (1), lane (2), . . . lane (n−1), include respective receivers 26, 27, 28, 29, each of which has a local clock recovery circuit, or other type of local clock recovery circuit. The local clock recovery circuits are arranged to produce local clocks (L CLK) which track a clock embedded in data signals received on the corresponding lanes. The local clock recovery circuits in the receivers receive a reference clock from a reference clock source 35. The reference clock source 35 can be a clock multiplier unit for example, which is arranged to produce a reference clock having a frequency close to that of a clock embedded in the data signals, using an on-board oscillator reference or other oscillator reference. In other embodiments, the reference clock source could be external to the integrated circuit. Also, the local clock recovery circuits can be configurable using control/status registers 36, which store parameters on the integrated circuit 20.

The local clocks (L CLKs) for the plurality of receivers are arranged in this implementation for connection to the local clock recovery circuits in another receiver. In the embodiment shown in FIG. 1, the local clock in each lane is coupled to its adjacent lane in a daisy chain sequence, as represented by the point-to-point loop connection 30.

During normal operation, the local clocks are used in their respective lanes for sensing data on the input lines. During testing of the receivers in the lanes, the local clock generated in one lane can be selected as a test clock in another lane under test, for use in place of the reference clock delivered from the source 35. Then, the lane under test can be operated to receive test data, and to test the performance of the local clock recovery circuit under conditions that are controlled by a local clock generated in a peer lane.

The local clock in the peer lane, which is to be used for testing a different lane, can be manipulated using test logic, such as built-in CDR test logic or external logic configured to communicate with the device, to perform testing outside typical manufacturing test conditions. In an alternative, or in addition to the built-in CDR test logic, manipulation of the local clock in the peer lane can be controlled by test equipment during a manufacturing process. The built-in CDR test logic, external logic, external test equipment or a combination of these elements can manipulate the control/status registers associated with the local clock recovery circuits in the receivers, or to manipulate other signals, so that the local clock generated in the peer lane simulates a variety of test conditions for the lane under test. Test conditions which can be simulated in this manner, include a variety of jitter conditions, spread spectrum conditions, and other conditions that relate to the sampling time for the data signals in each lane.

In addition, an integrated circuit like that of FIG. 1 can include a test data source, such as a pseudorandom number generator or a source of a stored pattern, to provide reference data to a selected one of the plurality of receivers under test. Note that this stored pattern is used in reference to data used for testing (e.g., jitter testing using transmitted data) and should not be confused with a test pattern applied by test logic, e.g., to distort a sampling clock so as to mimic effects of jitter.

FIG. 1 illustrates one example of an integrated circuit device comprising at least two receivers, in which each of the at least two receivers has a clock data recovery (CDR) circuit to generate a recovered clock from a reference clock using a respective data signal, as well as CDR test circuitry. The CDR test circuitry selectively substitutes the recovered clock generated by the CDR circuit of another one of the at least two receivers for the use as the reference clock for a receiver under test.

Figure 1A:
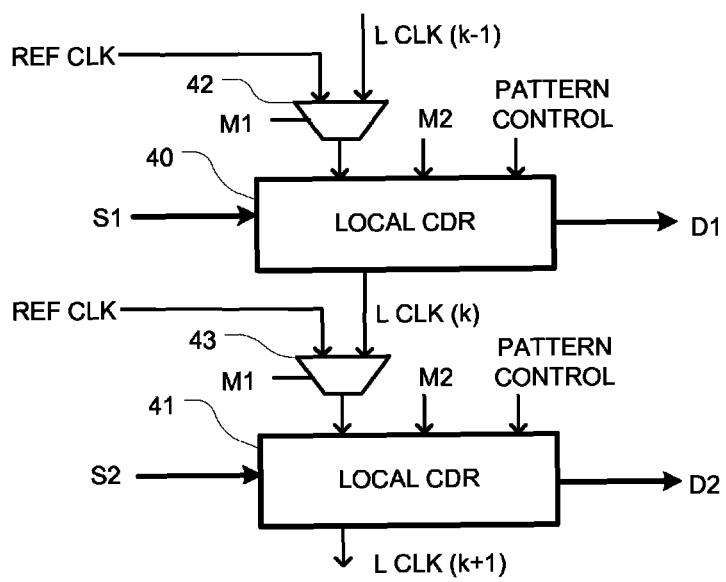
FIG. 1A illustrates a configuration of two clock and data recovery lanes set up to use a peer lane for a test clock.

FIG. 1A illustrates a means for simulating effects of jitter in one of the CDR circuits by substituting a clock produced using another one of the CDR circuits in lieu of the reference clock. This means can be used in integrated circuits like those represented by FIG. 1. As illustrated in FIG. 1A, signal lines S1 and S2 are coupled to local CDR circuits 40 and 41, respectively. The local CDRs recover data D1, D2 from the signals on lines S1 and S2, using a local recovered local clock during a normal operating mode. Clock selectors, such as multiplexers 42, 43, are connected to the local CDR circuits, and arranged to supply one of a first reference clock (e.g., a global reference clock such as REF CLK) or the local clock LCLK from the peer lane. In this example, multiplexer 42 selects between the reference clock REF CLK and the local clock L CLK (k−1), and multiplexer 43 selects between the reference clock REF CLK and the local clock L CLK (k). Note that 0<=k<=N−1, with k−1 being equated to N−1 where k is zero. For example, in a two-receiver-only system, local clock L CLK (k+1) would be provided as the signal L CLK (k−1). The local CDR circuits 40 and 41 have a normal operating mode, a lane under test mode, and a test clock source mode. The modes are controlled conceptually in FIG. 1A by mode control signals M1 and M2. In the normal operating mode, the REF CLK is applied to the local CDR, which operates using a feedback loop to track the embedded clock in the signal S1. In this mode, the signal S1 typically carries mission function data. In the lane under test mode, the local clock from a peer lane (e.g., L CLK (k−1) for local CDR circuit 40) is applied to the local CDR, and the local CDR's feedback loop is enabled to track the embedded clock in the signal S1. During the lane under test mode, the signal S1 can carry test data from a local or external source. In the test clock source mode, the REF CLK is applied to the local CDR, and clock recovery tracking and the CDR feedback loop is disabled, while PATTERN CONTROL signals are applied to the CDR loop circuits. The PATTERN CONTROL signals manipulate the local CDR to produce a local clock that has desired characteristics for testing the lane under test, such as jitter and offset characteristics. This is to say, in the test clock source mode, the feedback loop for the local CDR is "broken," and these PATTERN CONTROL signals are used to generate jitter which remains uncorrected in the CDR circuit generating the associated clock, such that the jitter-seeded signal can be used to test another receiver.

The mode control signals M1, M2 and PATTERN CONTROL represent a way to program the local CDR circuits. These signals can be applied dynamically from external circuits, from on-chip test logic, and from control and status registers on chip. In some embodiments, one or more local CDR circuits could be programmed statically using fuses, or settings in control registers, to act in the test clock source mode. A variety of programming techniques can be used. In some embodiments, the PATTERN CONTROL signals are provided by a test pattern generator, which can include a pattern memory and/or logic to produce patterns for the test sequences (e.g., jitter variation sequences).

Figure 2:
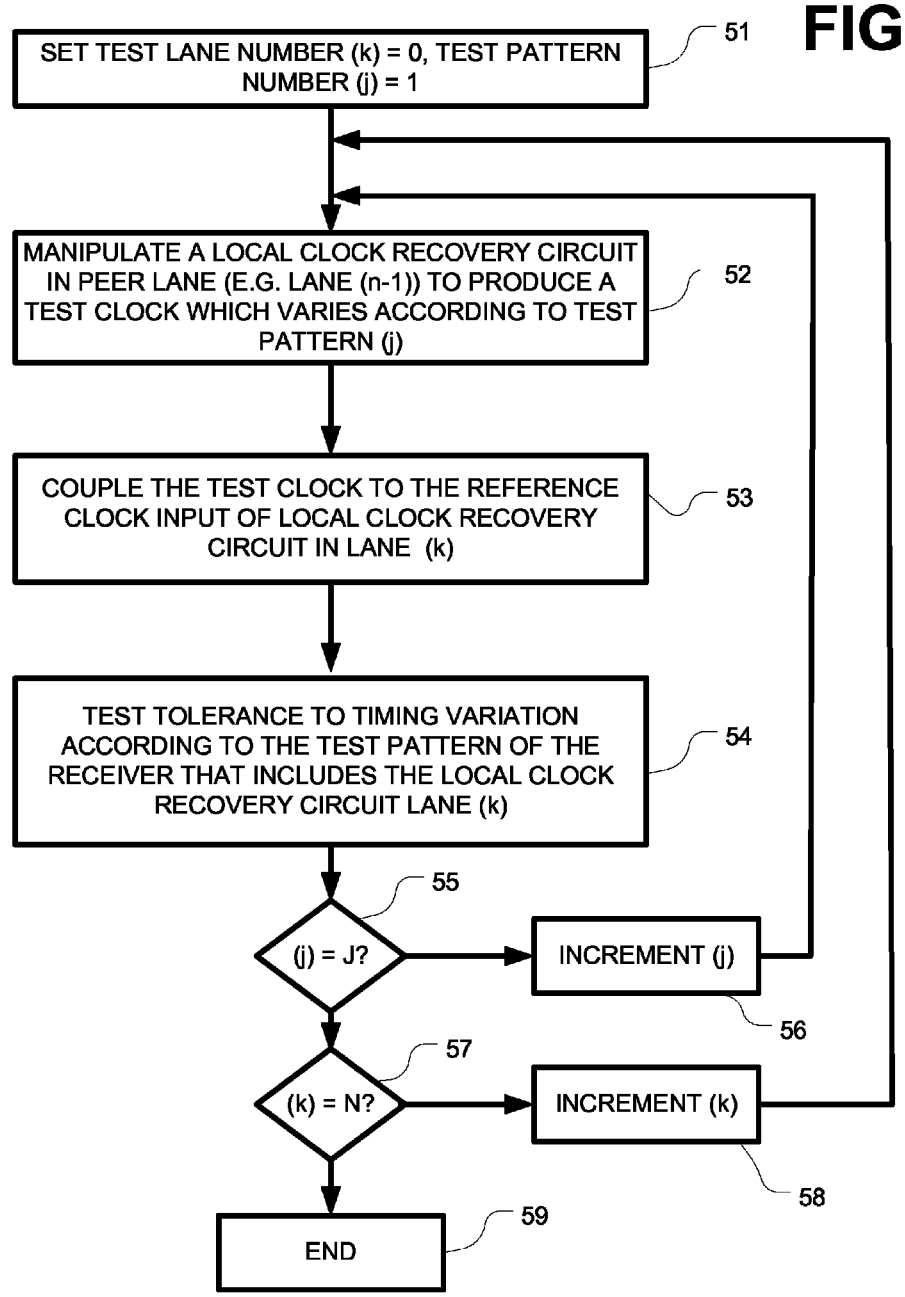
FIG. 2 is a simplified flow chart for a process for testing CDR lanes using peer lanes for a source of a test clock.

FIG. 2 is a flow chart of logic for testing an integrated circuit like that of FIG. 1. In this example, the algorithm begins by setting a test lane number (k)=0, and a test pattern number (j)=1, for use as an index to traverse the plurality of receivers, and a plurality of jitter patterns (51). Next, the logic manipulates local clock recovery circuits in another lane (e.g. lane (k−1) as has previously been introduced) using programmed parameters for example, to produce a test clock which varies according to the test pattern (j) (52). The test clock is coupled to the reference clock input of the local clock recovery circuit in lane (k) (53). Then, tolerance of the lane (k), the lane under test, to timing variations represented by the test pattern (j) is tested by delivering a sequence of data signals to the receiver in lane (k), and determining the performance of the receiver (54).

In embodiments where there is more than one test pattern, the logic proceeds to determine whether all of the test patterns have been executed (55). If not, then the index (j) is incremented (56), and the algorithm repeats starting with block 52. If at block 55, it is determined that all of the test patterns have been executed, then the logic determines whether all of the lanes have been tested (57). If not, then the index (k) is incremented (58) and the algorithm repeats starting with block 52. If at block 57, it is determined that all of the lanes have been tested, then this algorithm ends (59). Note that any form of test pattern can be used, and the different test patterns can be used for different lanes, if desired.

Figure 3:
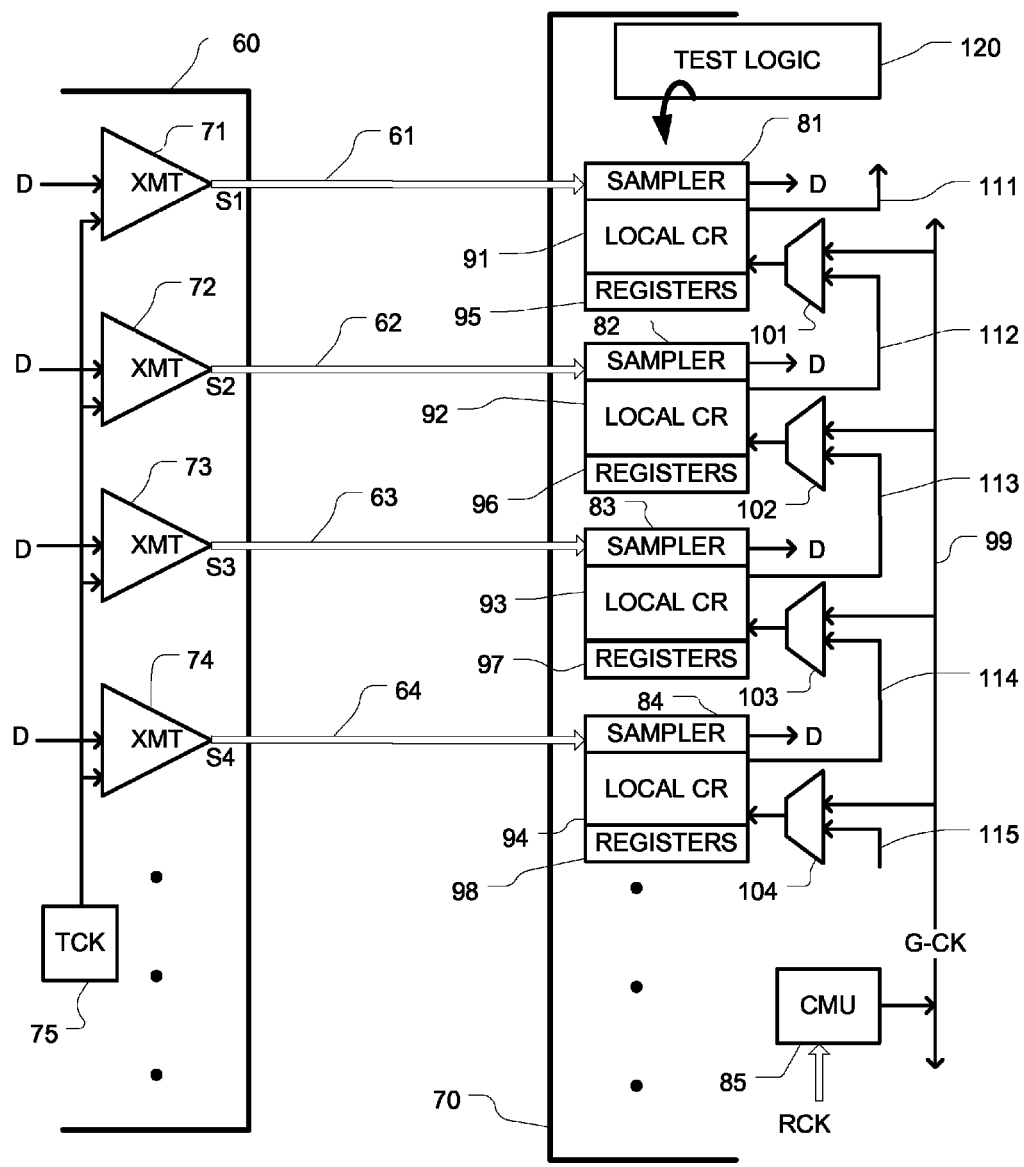
FIG. 3 is a simplified diagram of a system including clock recovery circuits as described herein, arranged for jitter testing using a clock from a peer lane.

FIG. 3 is a simplified diagram of a first integrated circuit 60 which is connected by a plurality of communication lines 61-64 to a second integrated circuit 70. In a representative embodiment, the first integrated circuit 60 comprises a memory controller and a second integrated circuit 70 comprises a memory device such as a dynamic random access memory DRAM. The first integrated circuit 60 in this embodiment includes transmitters 71-74 for driving respective data signals ("S1" to "S4") to the second integrated circuit 70. Each data signal S1 to S4 conveys a data stream that is encoded to have a transition density that conveys a corresponding data clock on the corresponding one of communication lines 61-64 to the second integrated circuit 70. A transmit clock generator 75 in this example produces a transmit clock which is provided to each of the transmitters 71-74 and used to time transmission of the associated signal. It is this clock for each lane (subject to local variation) that is recovered by the clock recovery circuit in the second integrated circuit and used to time the sampling of data transmitted in the associated lane. As indicated in the drawing by ellipses associated with the communication channels (and seen toward the bottom of the Figure), the number of channels between the integrated circuits can vary from one to many.

Note that in one embodiment, each transmitter 71-74 uses a respective data clock, which can be derived in some manner from the transmit clock generator 75 (e.g., each transmitter can transmit according to a respective phase). Note that other embodiments also exist, i.e., the various transmitters 71-74 can be on different chips transmitting to a common second integrated circuit 70.

The data signals "S1" to "S4" can be produced according to a variety of known encoding protocols, from basic non-return to zero NRZ or Manchester encoded data to other encoding techniques applied in multilane, gigabit SERDES channels. For example, two frequently-used encoding techniques are 8b10b coding and 64b66b coding. These and similar schemes take a quantum of data (e.g., 8 bits representing 256 possible data values) and map these data points to a larger code space (e.g., 10 bit codes representing 1024 possible data values), relying on values which emphasize a certain minimum transition density for transmitted information; because only a small subset of the larger code space is needed to transmit valid values, that subset can be chosen in a manner that guarantees a certain density of bit value changes relative to previously transmitted codes. In some coding schemes, a transition is guaranteed no less frequently than every two clock periods, synchronized with a clock edge. In others, a transition is guaranteed no less frequently than every 100 or more clock periods. Through recovering a local clock synchronized to transitions in the associated data signal, it becomes possible to sample the data signals at times close to an ideal sampling time (e.g., a midpoint between successive rising and falling edges) and so maximize the likelihood of correct interpretation of the individual data symbols that make up the transmitted data. Note that the use of per-lane or per-information signal clock recovery provides an alternative to periodic phase calibration between the various integrated circuits, i.e., through clock recovery, each receiver self-adjusts for phase drift and other timing changes to properly sample the incoming information signal.

The second integrated circuit 70 shown in FIG. 3 includes a receiver on each lane, corresponding to respective ones of the communication lines 61-64. These receivers in the illustrated example include corresponding samplers 81-84, which receive and sample the signals on the communication lines 61-64 at local sampling times determined using recovered local clocks, and produce the corresponding data streams "D1" to "D4."

The local clocks are produced by local clock recovery circuits 91-94 associated with corresponding samplers 81-84. The local clock recovery circuits receive selected reference clocks from corresponding selectors 101, 102, 103, 104, the inputs of which include a global reference clock (G-CK) across a clock line 99 from a global clock generator 85, and a local clock from another lane. The reference clock on line 99 can be a global reference clock, in the sense that it can be utilized by all of the receivers in the plurality of receivers. In other embodiments, the reference clock may not be a global reference clock in this sense. Thus, selector 101 is coupled to clock line 99 and to line 112. Line 112 carries the local clock from local clock recovery circuit 92. Selector 102 is coupled to clock line 99 and to line 113. Line 113 carries the local clock from local clock recovery circuit 93. Selector 103 is coupled to clock line 99 and to line 114. Line 114 carries the local clock from local clock recovery circuit 94. Selector 104 is coupled to clock line 99 and to line 115. Line 115 carries the local clock from another peer lane (not shown). In some embodiments, line 115 is coupled to line 111, which carries the local clock from local clock recovery circuit 91. The local clock distribution net in this example is arranged in a daisy chain. Other arrangements of the local clock distribution net can be used, including for example, an arrangement in which only a subset (1 or more) of the local clock recovery circuits is used for supplying test clocks to other lanes. In order to provide for testing of all the lanes in a plurality of lanes using a test clock produced by a lane other than the one being tested, in some embodiments, at least two lanes having clock recovery circuits selectively operable to produce a test clock are employed; such a structure facilitates the use of a second test clock when a lane producing a first test clock is itself tested.

The global clock generator 85 can comprise a clock multiplier unit CMU for example that includes a phase locked loop PLL responsive to a reference clock RCK. RCK can be produced locally on the second integrated circuit 70, or provided from an external source, including for example a clock transmitted from the first integrated circuit 60, as suits a particular embodiment.

The local clock recovery circuits 91-94 can be individually tuned using control registers 95-98, for example. The individual tuning provides for performance advantages that compensate for variations in the physical communication paths served by the corresponding receivers. For example, control register values can be used to enable and disable parts of the local clock recovery loops, such as second order elements and frequency tracking. The control register values can be used to set integral gain in the local clock recovery loops to change the speed of frequency tracking. The control register values can be used to set proportional gain in the local clock recovery loops. The control registers 95-98 can be manipulated by on-chip test logic 120, test logic on other chips coupled to the chip under test, or external test equipment, for use of the local clock recovery circuits in one lane to provide the test clocks for other lanes as described above. Also, the on-chip test logic 120 can control the local clock recovery circuits in other ways, to produce test clocks. Using these techniques, the local clocks being used for test clocks can be manipulated to simulate timing variations, including static parts per million PPM jitter, spread spectrum clocking, sinusoidal jitter, periodic jitter of other types, random jitter and so on.

The local clock recovery circuits which are configured for producing test clocks and for using a test clock produced from another lane, along with logic to apply test data signals and produce test results, as described herein thus provide a means for simulating effects of jitter in one of the CDR circuits, by substituting a clock generated using another one of the CDR circuits in lieu of the reference clock, and tracking error in the recovered clock produced by the one of the CDR circuits.

The local clock recovery circuits and test logic which are configured for producing test clocks as described herein thus provide a means for manipulating a first local clock recovery circuit in a first receiver in the plurality of receivers to produce a test clock which varies according to a test pattern. The local clock recovery circuits which are configured for using a test clock produced from another lane, along with logic to apply test data signals and produce test results, thus provide a means for performing a test of a second receiver in the plurality of receivers that includes a second local clock recovery circuit using the test clock as the reference clock.

Figure 4:
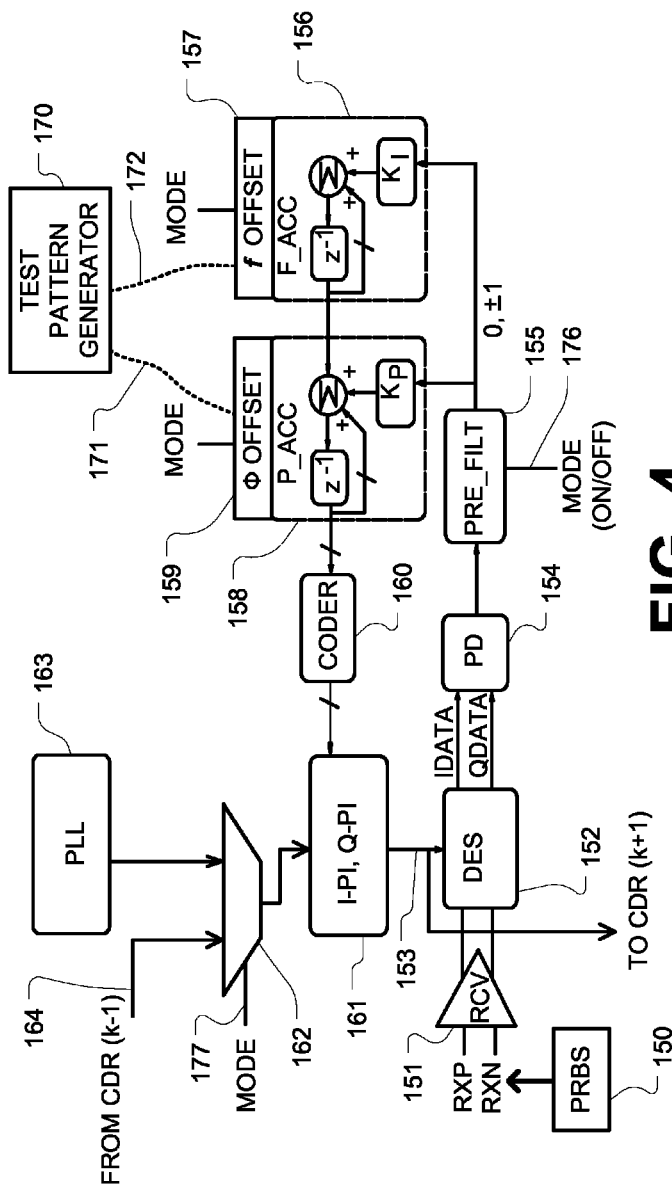
FIG. 4 is a block diagram of a local clock recovery circuit for a receiver lane, including circuits arranged for testing processes as described herein.

FIG. 4 is a more detailed diagram of one example receiver and local clock recovery circuit configured for use in a system like that of FIG. 3. In this example, an input data signal is provided on RXP and RXN signal line connection pads to a receiver front end 151. The output of the receiver front end 151 is applied to a deserializer 152 which is timed according to a local clock on line 153. The output of the deserializer 152 is provided as in-phase and quadrature phase data lines IDATA, QDATA to a phase detector 154. The phase detector 154 produces phase error signals that are applied to a clock control loop including a pre-filter 155. The phase error signals in this example consist of digital signals (0, +1, −1) indicating whether the sample timing is ahead of the clock carried by the data signal, behind the clock carried by the data signal, or synchronized within an accuracy of the circuitry, with the clock carried by the data signal.

The output of the pre-filter 155 is applied to a frequency accumulator circuit 156 and to a phase accumulator circuit 158.

The frequency accumulator circuit 156 can be modeled as shown in the diagram by an integral gain constant $K_1$, a summing node, and an integrating node which are arranged to generate a frequency offset value f OFFSET stored in a register, schematically represented by block 157. The summing node in the frequency accumulator circuit receives the phase error signals from the pre-filter 155 and feedback from the output of the integrating node, so as to accumulate the phase errors to produce a frequency offset value. The phase accumulator circuit 158 can be modeled as shown by a phase gain constant $K_P$, a summing node and an integrating node which are arranged to generate the phase offset value $\phi$ OFFSET stored in a register schematically represented by block 159. The summing node in the phase accumulator circuit 158 receives the frequency offset value from register 157, the phase error signals from the pre-filter 155 and feedback from the output of the integrating node to produce the phase offset value.

The phase offset value is applied to a coder 160 which translates the output of the integrating node into a form usable by the phase interpolator circuit 161, to select an output phase for the local clock as applied on line 153 to the deserializer 152.

The selected reference clock is provided at the output of a local clock selector 162, and is then input to the phase interpolator circuit 161. The inputs to the local clock selector 162 include a local clock on line 164 output from a peer lane, such as the CDR in lane (k−1), and the output from the global clock generator, which in this example is represented by phase locked loop 163 (note that as the name implies, in some embodiments, the output of the local clock generator is also shared with other lanes' circuitry, although this is not illustrated in FIG. 4). The phase interpolator circuit 161 provides in-phase and quadrature phase versions of a local clock to the deserializer 152.

FIG. 4 also illustrates a pseudorandom bit sequence PRBS generator 150 which is used to generate data arriving via RXP and RXN signal line connection pads. The PRBS generator 150 can be the same integrated circuit as transmitters used to generate the data signals arriving at RXP and RXN, and in other embodiments, it can be on the same integrated circuit as the receivers.

A test pattern generator 170 can be on the same integrated circuit, on external test equipment or on another device that is in communication with the device being tested. Note that the test pattern generator is used to create perturbances used to generate the test clock, e.g., the test pattern is used in this example to simulate jitter on the data line of another lane. The test pattern generator 170 in this example is coupled via lines 171 and 172 to the registers 157 and 159 in the frequency accumulator circuit 156 and phase accumulator circuit 158, respectively. The test logic can manipulate the values in the registers 157 and 159 to control the signal applied to the coder 160. Thereby, the local clock can be controlled according to test patterns to form the test clock. In order to manipulate the local clock, the clock control loop is broken by turning off the pre-filter 155, in this example using a mode control signal 176.

Figures 5, 6:
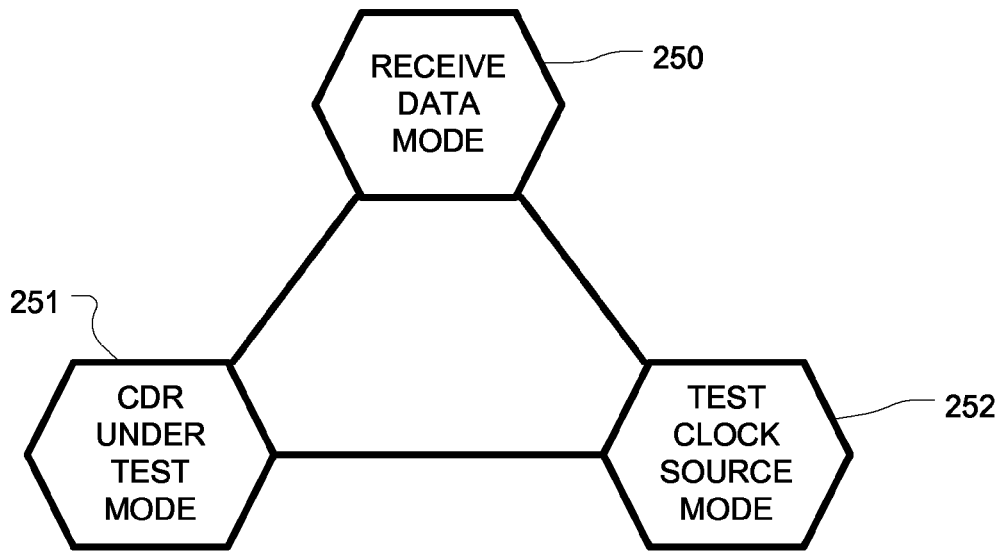
FIG. 5 shows example control and status registers for embodiments of devices as described herein.
FIG. 6 is a simplified mode or state diagram for a clock and data recovery circuit for use in a CDR test using a peer lane for a test clock.

FIG. 5 is a simplified state diagram illustrating three modes of operation which can be executed using the circuit of FIG. 4. Illustrated modes include a receive data mode 250, a CDR under test mode 251, and a test clock source mode 252. In the receive data mode 250, the lane is being operated for its mission function. In the CDR under test mode 251, the lane is being tested using a test clock generated by a peer lane. In the test clock source mode 252, the lane is being used to produce a test clock to be applied in testing a different lane on the chip.

The mode of operation of the local clock recovery circuit in FIG. 4 can be set by mode control signals 176 and 177. When the local clock recovery circuit of FIG. 4 is in receive data mode 250, the mode control signal 176 turns on the clock recovery loop at the pre-filter 155, and causes the local clock selector 162 to select the reference clock from the phase locked loop 163. When the local clock recovery circuit of FIG. 4 is in the test clock source mode 252, the mode control signal 176 turns off the clock recovery loop at the pre-filter 155, and introduces a local clock at the output of the phase interpolator which is manipulated by the test logic. In the test clock source mode, the CDR circuit ignores any transitions in inbound data signals and reacts only under control of the programmed parameters for the test clock. The clock recovery loop is "broken" in this mode, or runs "open-loop" so that the CDR does not try to simultaneously adjust itself to match pattern variation in an inbound data signal. When the local clock recovery circuit of FIG. 4 is in the CDR under test mode 251, the mode control signal 176 turns on the clock recovery loop at the pre-filter 155, and the mode control signal 177 causes the local clock selector 162 to select the test clock generated in the peer lane. Also, a test sequence, using for example the PRBS generator 150, is applied to the input of the receiver front end 151. Although not shown in FIG. 4, the deserializer 152 also outputs received data. If the PRBS generator 150 is located on a separate transmitter chip to provide test data arriving via RXP and RXN signal line pads, a source of data to be used as a reference for comparison is also locally supplied, such that the device can test the extent to which the CDR under test is able to accurately track the inbound (PRBS) data pattern. Note that if PRBS structures are used and represent a common generator polynomial, the inbound and reference PRBS patterns can be synchronized by running them at slightly different rates until their patterns align; this synchronization can also be effectuate by test logic manipulation of values as described above.

FIG. 6 illustrates a register file which can be controlled by the test logic for manipulating the clock recovery circuit in a selected lane to produce a test clock having a test pattern. Time-varying patterns can be written in the registers that effect the clock recovery loops, such as CDR phase and frequency registers, to create more complex jitter profiles (like sinusoidal jitter etc.). In this example, the register file includes a mode register 201 which indicates the mode of each lane. Also, the register file includes a frequency offset value register 202 for each lane, and a phase offset value register 203 for each lane. The register file shown in FIG. 6 includes a local clock select value register 204 for each lane, which supplies the value for the mode control signal 177 for a circuit like that shown in FIG. 4. The register file shown in FIG. 6 includes a pre-filter enable register 205 for each lane, which supplies the value for the mode control signal 176 for a circuit like that shown in FIG. 4. The register file shown in FIG. 6 includes a pseudorandom bit sequence enable register 206 for each lane, which causes selective connection of the source of test data to the lane under test. In this example, the register file also includes a pattern generator enable register 207 for each lane. The pattern generator enable register 207 supplies control signals to the test logic for example used in generating a variety of test patterns. Finally, in this example, the register file includes a CDR test result register 208 for each lane which can store a variety of indicators that relate to the results of the testing. Other parameters not shown in FIG. 6, which could be manipulated to produce a test clock include registers that set values or modes, including but not limited to, CDR proportional gain, CDR integral gain, CDR second order enable, spread spectrum clocking tracking enable, loop divider (to further boost CDR gain), phase register manual overwrite enable, phase register manual load, frequency register manual overwrite enable, and frequency register manual load. In addition to manipulation of the values represented by registers associated with the CDR loop, the output of the phase detector, such as up/down signals, can be manipulated to produce the test clock.

In the example shown in FIG. 4, the phase offset value and frequency offset value are manipulated by the test logic by writing to the registers 157, 159 in order to generate the test clock. In other examples, or in combination with the writing of the registers 157, 159, the test logic can also manipulate control registers shown in FIG. 6, or other components that can control the output of the local clock recovery circuit.

Figure 7:
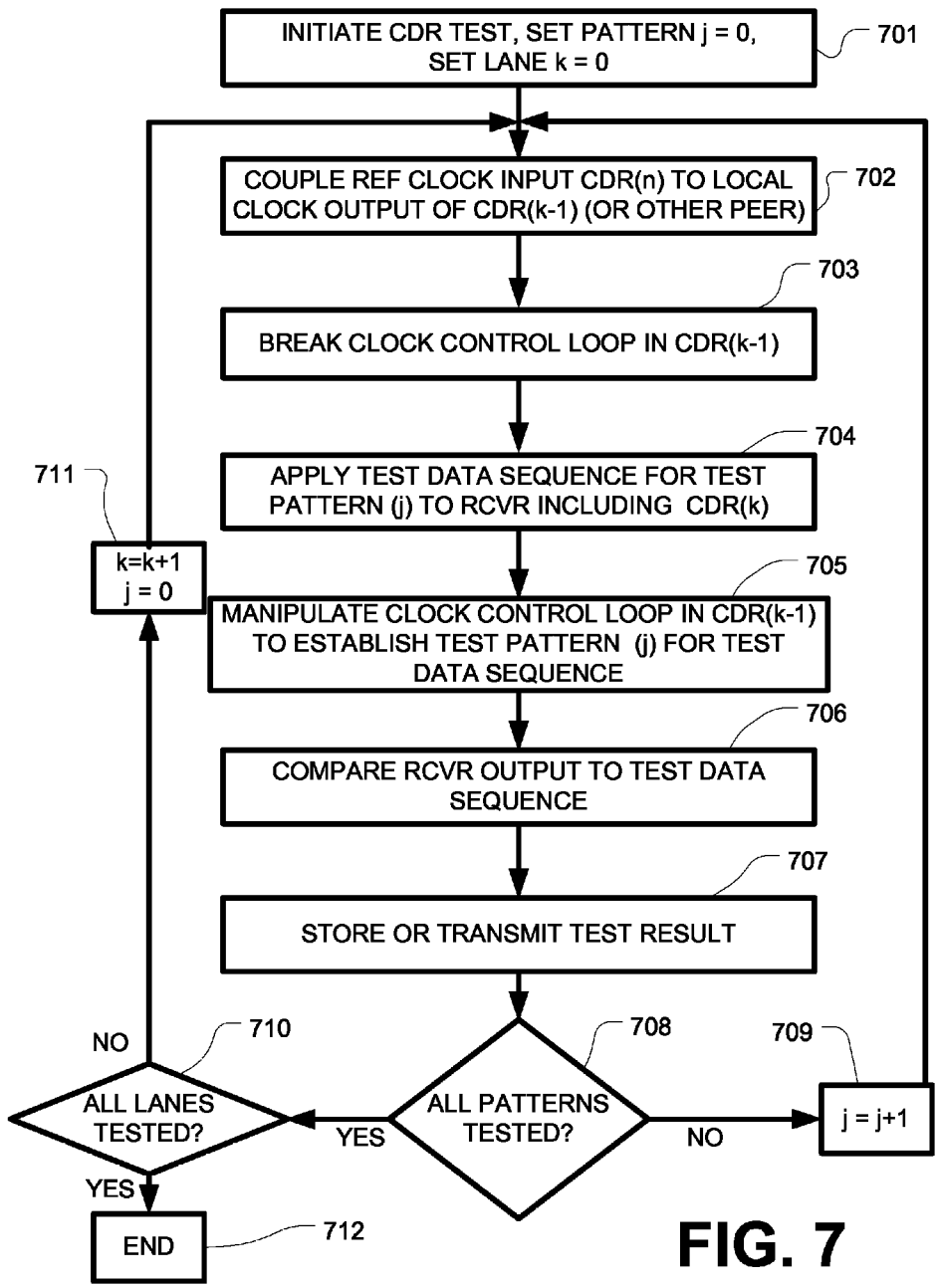
FIG. 7 is a flow chart of one example CDR test process using a peer lane for a test clock.

FIG. 7 is a flowchart of a testing algorithm implemented by test logic for an integrated circuit device that includes a plurality of lanes ($0<=k<=N-1$), where the test logic tests performance of each of the lanes according to test patterns that simulate sample time variation such as random jitter, sinusoidal jitter, other periodic jitter, spread spectrum clocking and so on. The sequence of steps shown in FIG. 7 can be changed in various implementations, including sequences in which more than one function is accomplished at the same time, or in opposite order from that shown in the Figure. The logic of FIG. 7 is described with reference to the CDR circuitry shown in FIG. 4. It will be understood however that the test logic represented by FIG. 7 can be applied to other CDR implementations as well. The system implementing the test logic can store a plurality of test patterns (j), each of which is adapted to test different variations of sample timing. As illustrated, the test for the CDR circuit on a set of lanes on a device is initiated by setting an index j=0 for the test pattern to a starting value, and setting an index k=0 for the lane under test to a starting value (701). Next, the logic causes a local clock selector (e.g. by asserting the MODE control signal on line 177 to the local clock selector 162) on the CDR under test to couple the reference clock input to the local clock output of a peer CDR, such as CDR (k−1) (702). The logic then causes the control loop in the peer CDR (CDR (k−1)) to break, such as by asserting the MODE control signal on the line 176 at the pre-filter 155 (703), whereby it is decoupled from the error signals if any, produced in the peer CDR (CDR (k−1)). The clock control loop in the peer CDR (CDR (k−1)) can be disabled at other logic components as well, such as using the phase detector 154, or by setting the inputs to the phase accumulator and frequency accumulator blocks 156, 158 to a constant value.

Next, a test data sequence, such as a pseudorandom bit sequence PRBS selected for the test pattern (j), is applied to the receiver that includes the CDR under test (704). This can be accomplished by setting a switch on the integrated circuit device which couples the output of the pseudorandom bit sequence PRBS generator 150 to the input of the selected lane (k). In a next step, the clock control loop in the peer CDR (CDR (k−1)) is manipulated to cause the local clock generated in that peer CDR to simulate the test pattern (j) (705). As described above, the clock control loop can be manipulated using the parameter registers and the registers which correspond with the outputs of the accumulator circuits in a system like that of FIG. 4 to cause the local clock in the peer CDR to vary according to selected patterns. The received data in the lane that includes the CDR under test, which is sampled while the sample timing is manipulated using the local clock of the peer CDR, is compared with the test data sequence (706). This can be accomplished by storing the received data based on the test data sequence in memory, either on the integrated circuit being tested, or on equipment or other integrated circuits coupled to the integrated circuit under test, and later comparing it to the expected test data sequence, or can be accomplished using bit-by-bit comparisons as the data is received, depending on the implementation desired. In the case of the use of a PRBS for the test data sequence, digital logic operates based on the last few bits received to predict the next bit using logic given the nature of the sequence (PRBS7, PRBS15 etc.), and the next bit is compared with the expected value to indicate the performance of the CDR circuit. Next, the test result can be stored or transmitted to other systems for analysis (707). The logic then determines whether all of the test patterns have been executed (708). If not, then the index (j) for the test patterns is incremented (709), and the loop returns to block 702. If, however, all the test patterns have been tested at block 708, then the logic determines whether all of the lanes had been tested (710). If all of the lanes have not been tested, then the index (k) for the lanes is incremented (711), and the loop returns to block 702. If however all of the lanes have been tested at block 710, then this test logic sequence is complete (712).

Figure 8:
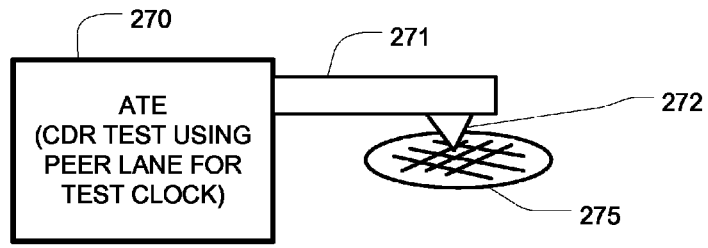
FIG. 8 is a conceptual diagram of a test set up for use in manufacturing a device as described herein.
Figure 9:
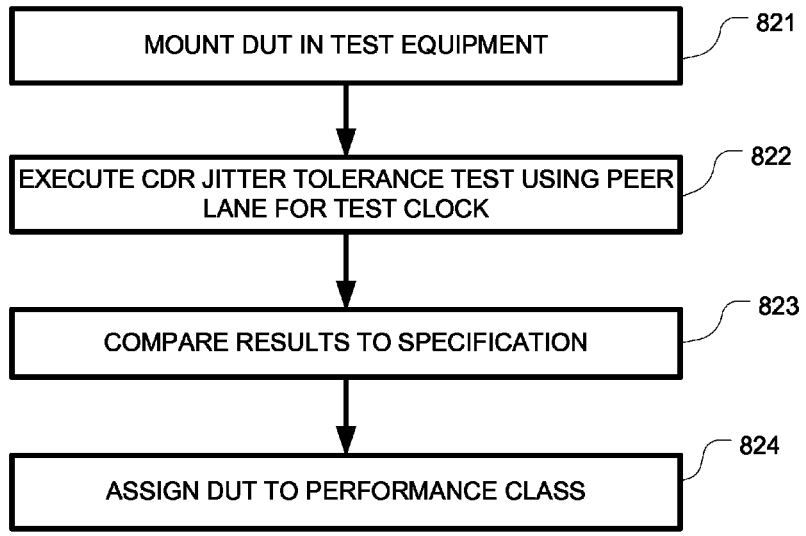
FIG. 9 is a flow chart of a manufacturing process using CDR test processes such as the processes of FIGS. 2 and 7.
Figure 10:
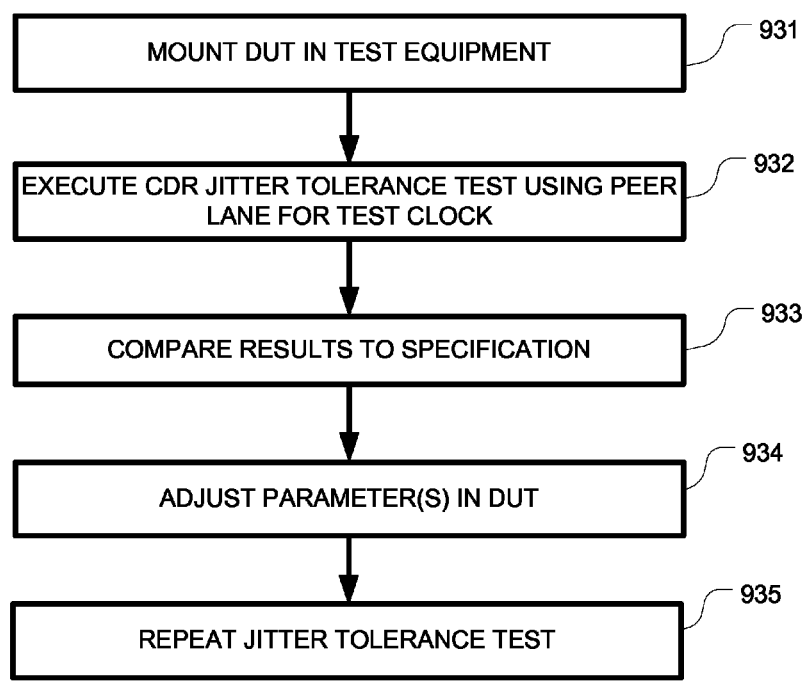
FIG. 10 is a flow chart of another manufacturing process using CDR test processes such as the processes of FIGS. 2 and 7.

FIG. 8 is a conceptual diagram of a testing system in which the CDR lock and tolerance of integrated circuits to jitter and other sample timing variations can be tested during manufacturing. The system includes automatic test equipment ATE 270, and a wafer probe 271, having a probe contact 272 that is adapted for contacting test pads on the integrated circuit die on a wafer 275, during a manufacturing process. Examples of manufacturing processes that can be executed using the system of FIG. 8 are shown in FIGS. 9 and 10. The ATE 270 comprises a data processing system that is programmed for testing integrated circuits, usually for a variety of purposes. Such data processing systems include components such as processor units, memory systems, communication systems and other elements common to computers used in manufacturing. Logic to execute processes to support testing algorithms such as those described in FIG. 2 or 7, comprises computer programs stored in or accessible to the ATE 270 along with supporting components of the ATE 270. In some embodiments, parts of the logic represented by FIG. 2 or 7 are embodied in built-in test logic on the integrated circuit, and other parts of the logic are embodied in the ATE 270. For example, the ATE may serve to write control registers to set up the test mode for the device, to determine the test patterns to be applied, and to store the results, while the built-in test logic controls the local CDR circuits during execution.

FIG. 9 illustrates one manufacturing flow which can be executed using a system such as that of FIG. 8. In a first step, the device under test is mounted in test equipment (821). The device under test can be part of the wafer, such as wafer 275 shown in FIG. 8, or an individual die which can be packaged prior to testing for example. Next, the CDR test is executed using a peer CDR to produce the test clock, as described above (822). As mentioned above, a number of sample timing performance tests other than jitter, such as testing the ability to operate or achieve lock, with spread spectrum clocks over specified frequency ranges, and a number of types of jitter, can be executed at this stage. A next step in the manufacturing process is to compare the results of the testing to specifications for the devices being manufactured (823). After comparing the results to the specifications, the device under test can be assigned to a performance class or "bin" (824). Then the manufactured devices can be utilized in different technological settings depending on their assigned performance class.

FIG. 10 illustrates another manufacturing flow which can be executed using a system such as that of FIG. 8. In a first step, the device under test is mounted in test equipment (931). The device under test can be part of a wafer, such as the wafer 275 shown in FIG. 8, or an individual die which can be packaged prior to testing for example. Next, the CDR test is executed using a peer CDR to produce the test clock, as described above (932). As mentioned above, a number of sample timing performance tests other than jitter, such as testing the ability to achieve lock with spread spectrum clocks over specified frequency ranges, and a number of types of jitter, can be executed at this stage. A next step in the manufacturing process is to compare the results of the testing to specifications for the devices being manufactured (933). After comparing the results to the specification, parameters for the CDR circuits in the device under test can be adjusted, such as by adjusting the gain values stored in the register files for the clock control loop (934). After adjusting the parameters in the CDR circuits, the tests can be repeated (935) until the device meets performance specifications.

Figure 11:
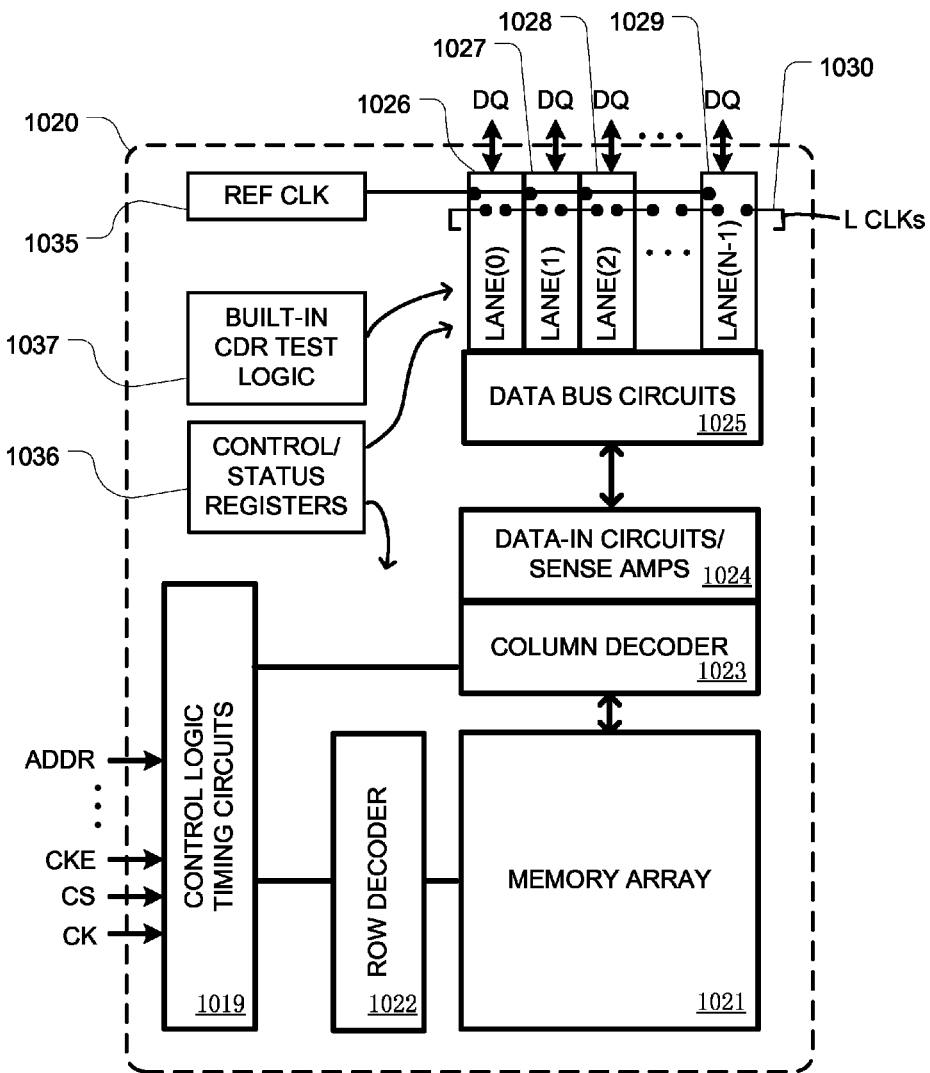
FIG. 11 is a simplified diagram of an integrated circuit memory including a plurality of clock and data recovery lanes as described herein.

FIG. 11 is a simplified block diagram of an integrated circuit 1020 that includes a memory array 1021. A row decoder 1022 and column decoder 1023 are coupled to the memory array 1021, and to control logic and timing circuits 1019 from which address signals and other control signals are supplied. Data is supplied to and delivered from the memory array 1021 through the block labeled "data-in circuits/sense amps" 1024, which is in turn coupled to the column decoder 1023. Data bus circuits 1025 in this diagram represent data paths on the integrated circuit from block 1024 to the input/output lanes, designated for the purposes of this description as lane (0), lane (1), lane (2), . . . lane (n−1).

The input/output lanes, lane (0), lane (1), lane (2), . . . lane (n−1), include respective receivers 1026, 1027, 1028, 1029, each of which has a local clock recovery circuit. The local clock recovery circuits are arranged to produce local clocks (L CLK) which track a clock embedded in data signals received on the corresponding lanes. The local clock recovery circuits in the receivers receive a reference clock from a reference clock source 1035. The reference clock source 1035 can be a clock multiplier unit for example, which is arranged to produce a reference clock having a frequency close to that of a clock embedded in the data signals. Also, the local clock recovery circuits can be configurable using control/status registers 1036, which store parameters on the integrated circuit 1020.

The local clocks (L CLKs) for the plurality of receivers are arranged in this implementation for connection to the local clock recovery circuits in another receiver. In the embodiment shown in FIG. 11, the local clock in each lane is coupled to its adjacent lane in a daisy chain sequence, as represented by the point-to-point loop connection 1030.

During normal operation, the local clocks are used in their respective lanes for sensing data on the input lines. During testing of the receivers in the lanes, the local clock generated in one lane can be selected as a test clock in the lane under test, for use in place of the reference clock delivered from the reference clock source 1035. Then the lane under test can be operated to receive test data, and to test the performance of the local clock recovery circuit under conditions that are controlled by a local clock generated in a peer lane.

The local clock in the peer lane, which is to be used for testing a different lane, can be manipulated using test logic, such as built-in CDR test logic 1037 in this example. In an alternative, or in addition to the built-in CDR test logic 1037, manipulation of the local clock in the peer lane can be controlled by test equipment during a manufacturing process as described in more detail below. The built-in CDR test logic, external test equipment or a combination of these elements can manipulate the control/status registers associated with the local clock recovery circuits in the receivers, or to manipulate other signals, so that the local clock generated simulates a variety of test conditions. Test conditions which can be simulated in this manner, include a variety of jitter conditions, spread spectrum conditions, and other conditions that relate to the sampling time for the data signals in each lane.

In addition, the built-in CDR test logic 1037 can include a test data source, such as a pseudorandom number generator, which is used during testing along circuits operable to connect the test data source to a selected one of the plurality of receivers. Although the embodiment illustrated shows the plurality of lanes serving data signals for a memory circuit, other embodiments can comprise integrated circuits with a plurality of lanes of serial data channels for other purposes.

An apparatus is described herein comprising a plurality of receivers; a local reference clock selector coupled to each of the plurality of receivers, arranged to select a reference clock from a set of at least two choices including (i) a reference clock, and (ii) a local clock generated by the another one of the receivers in the plurality of receivers; and each of the plurality of receivers including a local clock recovery circuit, each local clock recovery circuit including a clock control loop responsive to at least one loop control signal, the local clock recovery circuit to modify the selected reference clock to generate the local clock in response to selective one of (i) a corresponding data signal, and (ii) a signal applied to the clock control loop.

An integrated circuit device is described herein comprising at least two receivers; each of the at least two receivers having a clock and data recovery (CDR) circuit to generate a recovered clock from a reference clock in response to a respective data signal; and CDR test circuitry for one of the receivers, the CDR test circuitry to selectively substitute a clock generated by the CDR circuit of another one of the at least two receivers for use as the reference clock by the one of the receivers.

A method is described herein for testing a device including a plurality of receivers having respective reference clock inputs, comprising manipulating a local clock recovery circuit in a first receiver in the plurality of receivers to produce a test clock which varies according to a test pattern; coupling the test clock to the reference clock input of a local clock recovery circuit in a second receiver in the plurality of receivers; and performing a test of the second receiver using the test clock. In said just mentioned method, the test can comprise a jitter tolerance test.

In said just mentioned method, the local clock recovery circuit in the first receiver can include clock control loop, and said manipulating the local clock recovery circuit includes manipulating the clock control loop.

In said just mentioned method, the plurality of receivers can be elements of a single integrated circuit, and the method can include supplying a sequence of test data for the second receiver using a circuit on the integrated circuit.

In said just mentioned method, the local clock recovery circuit in the first receiver can include a clock control loop including a frequency accumulator generating a loop frequency value, and said manipulating the local clock recovery circuit in the first receiver can include providing a sequence of loop frequency values.

In said just mentioned method, the local clock recovery circuit in the first receiver can include a clock control loop including a phase accumulator generating a loop phase value, and said manipulating the local clock recovery circuit in the first receiver can include providing a sequence of loop phase values.

In said just mentioned method, the test pattern can simulate one or more of a random jitter condition, a periodic jitter condition, a frequency offset condition and a spread spectrum condition.

A method for manufacturing devices is described herein, where the devices include a plurality of receivers having local clock recovery circuits having respective reference clock inputs, the method comprising coupling a device to test equipment; manipulating a local clock recovery circuit in a first receiver in the plurality of receivers, using the test equipment, to produce a test clock which varies according to a test pattern; coupling the test clock to the reference clock input of a local clock recovery circuit in a second receiver in the plurality of receivers; and performing a test of the second receiver using the test clock.

In said just mentioned method, the method can include placing a wafer including a plurality of devices in a test platform; and said coupling can includes using a wafer probe to contact a device on the wafer for testing.

In said just mentioned method, the method can include modifying a control parameter in the second local clock recovery circuit in response to the test.

In said just mentioned method, the method can include classifying the device in response to the test.

It should be noted that the various circuits disclosed herein may be described using computer aided design tools and expressed (or represented) as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and VHDL, formats supporting register level description languages like RTL, and formats supporting geometry description languages such as GDSII, GDSIII, GDSIV, CIF, MEBES and any other suitable formats and languages. A memory including computer-readable media in which such formatted data and/or instructions may be embodied is a physically-manifested computer storage media in its various forms (e.g., having memory cells or magnetic or physically-defined recordation regions or attributes that store data, such as but not limited to, optical, magnetic or semiconductor storage media, whether independently distributed in that manner, or stored "in situ" in an operating system).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. In other instances, well-known circuits and devices are shown in block diagram form to avoid obscuring the present invention unnecessarily. Additionally, links or other interconnections between integrated circuit devices or internal circuit elements or blocks may be shown as buses or as single signal lines. Each of the buses may alternatively be a single signal line, and each of the single signal lines may alternatively be buses. Signals and signaling links, however shown or described, may be single-ended or differential. A signal driving circuit is said to "output" a signal to a signal receiving circuit when the signal driving circuit asserts (or de-asserts, if explicitly stated or indicated by context) the signal on a signal line coupled between the signal driving and signal receiving circuits. "Clock" is used herein to refer to a periodic timing signal used to coordinate actions between circuits on one or more integrated circuit devices. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The terms "exemplary" and "embodiment" are used to express an example, not a preference or requirement.

While the invention has been described with reference to specific embodiments thereof, it will be evident that various modifications and changes may be made thereto without departing from the broader spirit and scope. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. An integrated circuit, comprising:
   a first receiver to receive a first signal from a first transmitter via a first transmission path and a first clock recovery circuit to generate a first recovered clock from the first signal for use in sampling the first signal during a normal mode of operation;
   a second receiver to receive a second signal from a second transmitter via a second transmission path and a second clock recovery circuit to generate a second recovered clock from the second signal for use in sampling the second signal during the normal mode of operation; and
   circuitry to apply adjustments to a clock signal generated by the first clock recovery circuit during a test mode of operation, to deterministically-vary timing of the clock signal generated by the first clock recovery circuit during the test mode of operation, and to provide the clock signal with the deterministically-varied timing to the second clock recovery circuit for use as a reference clock during the test mode of operation.

2. The integrated circuit of claim 1, wherein:
   the second receiver is to generate data samples from the second signal during the test mode;
   the integrated circuit further comprises
      a register to identify an expected data pattern,
      a comparator to compare the expected data pattern with the data samples from the second receiver which are generated during the test mode, and
      circuitry to store errors represented as differences between the data samples from the second receiver during the test mode and the expected data pattern; and
   said stored errors are adapted for use in assessing ability of the second clock recovery circuit to track embedded clock timing represented by the second signal during the test mode, in the presence of the deterministically-varied timing in the reference clock.

3. The integrated circuit of claim 1, wherein:
   each of the first receiver and the second receiver are adapted to receive the respective first and the second signals as signals compliant with one of the PCIE-standards, and as signals having a transition density sufficient to convey a respective, embedded clock; and
   each of the first clock recovery circuit and the second clock recovery circuit are to detect the respective, embedded clock and generate the respective one of the first and second recovered clocks therefrom during the normal mode of operation.

4. The integrated circuit of claim 1, wherein:
   the circuitry to apply the adjustments comprises at least one register to receive programmable values to control the adjustments, the programmable values comprising at least one selective phase offset and at least one selective frequency offset, said circuitry to apply the at least one selective phase offset and at least one selective frequency offset to adjust timing of the clock signal generated by the first clock recovery circuit during the test mode of operation.

5. The integrated circuit of claim 1, wherein:
   the second clock recovery circuit comprises a second order clock recovery circuit; and
   the integrated circuit comprises at least one control register to receive a programmable value to selectively disable second order clock recovery by the second order clock recovery circuit.

6. The integrated circuit of claim 1, wherein:
   the integrated circuit further comprises logic to supply a jitter variation sequence to the circuitry, said circuitry to vary the timing of the clock signal generated by the first clock recovery circuit during the test mode to cause the reference clock to represent a time-varying pattern of jitter.

7. The integrated circuit of claim 1, wherein:
   the integrated circuit further comprises circuitry to selectively control reference clock provision to the second clock recovery circuit, to select between a global reference clock and the clock signal generated by the first clock recovery circuit during the test mode with the adjustments thereto.

8. The integrated circuit of claim 1, wherein:
the integrated circuit is dynamically programmable with control values to vary the adjustments; and
the circuitry to apply the adjustments is to vary the adjustments responsive to dynamic reprogramming of the control values.

9. The integrated circuit of claim 1, wherein:
each of the first clock recovery circuit and the second clock recovery circuit is a digital clock recovery circuit; and
each of the first clock recovery circuit and the second clock recovery circuit has a programmable gain.

10. The integrated circuit of claim 1, wherein:
each of the first signal and the second signal comprises a serial data signal, and each of the first receiver and the second receiver comprises a deserializer coupled to receive the respective first and second recovered clock during the normal mode of operation and to deserialize the respective data signal in response thereto; and
each of the first and second transmitters and each of the first and second transmission paths are external to said integrated circuit.

11. An integrated circuit, comprising:
receivers, each to receive a respective data signal from a respective transmitter via an external transmission path;
for each receiver, a clock recovery circuit to generate a respective recovered clock from the respective data signal for sampling the respective data signal during a normal mode of operation;
a reference clock input for each clock recovery circuit, each clock recovery circuit to generate the respective recovered clock relative thereto;
circuitry for use during a test mode of operation to, for at least one of the clock recovery circuits, apply adjustments to the clock signal generated by the at least one of said clock recovery circuits, to deterministically-vary timing of the clock signal generated by the at least one of said clock recovery circuits; and
circuitry for use during the test mode of operation to cause the clock signal with the adjustments to be substituted as the reference clock which is input to another one of said clock recovery circuits.

12. An integrated circuit of claim 11, wherein:
each one of said clock recovery circuits is daisy chained to another one of said clock recovery circuits;
each one of said clock recovery circuits is selectively operable, during the test mode, to generate the clock signal and have the adjustments applied thereto; and
each of said clock recovery circuits is selectively operable, during the test mode, to receive the clock signal with the adjustments thereto as its reference clock.

13. An integrated circuit of claim 12, wherein:
there are at least four of said receivers;
the integrated circuit comprises logic to cause a first one of said clock recovery circuits to source the clock signal with the adjustments applied thereto to a second one of said clock recovery circuit for use as the reference clock for the second one of said clock recovery circuits, and to pairwise vary selection of the first one of said clock recovery circuits and the second one of said clock recovery circuits so as to test each of said clock recovery circuits; and
the integrated circuit further comprises
a register to identify an expected data pattern,
a comparator to compare the expected data pattern with data samples produced from one of said receivers during the test mode which corresponds to the second one of said clock recovery circuits, and
circuitry to store errors represented as differences between the data samples and the expected data pattern; and
said stored errors being adapted for use in assessing ability of the second one of said clock recovery circuits to track embedded clock timing represented by the respective data signal during the test mode, in the presence of the deterministically-varied timing in the reference clock supplied to the second one of said clock recovery circuits.

14. The integrated circuit of claim 11, wherein:
each of said clock recovery circuits comprises a second order clock recovery circuit; and
the integrated circuit comprises at least one control register to receive a programmable value to selectively disable second order clock recovery by each of said second order clock recovery circuits.

15. The integrated circuit of claim 11, wherein:
the integrated circuit further comprises logic to supply a jitter variation sequence to the circuitry to apply the adjustments, the circuitry to apply the adjustments to responsively cause the clock signal generated by the at least one of said clock recovery circuits to represent a time-varying pattern of jitter.

16. The integrated circuit of claim 11, wherein:
the integrated circuit further comprises circuitry to selectively control reference clock provision to each of said clock recovery circuits, to select between a global reference clock and the clock signal generated by another of said clock recovery circuits during the test mode with the adjustments thereto.

17. The integrated circuit of claim 11, wherein:
the integrated circuit is dynamically programmable with control values to vary the adjustments; and
the circuitry to apply the adjustments is to vary the adjustments responsive to dynamic reprogramming of the control values.

18. The integrated circuit of claim 11, wherein:
each of said clock recovery circuits is a digital clock recovery circuit; and
each of said digital clock recovery circuits has a programmable gain.

19. The integrated circuit of claim 11, wherein:
each data signal comprises a serial data signal, and each of the receivers comprises a deserializer coupled to receive the respective recovered clock during the normal mode of operation and to deserialize the respective serial data signal in response thereto.

20. An integrated circuit, comprising:
at least four receivers, each to receive a respective serial data signal from a respective transmitter via an external transmission path and each to deserialize the respective serial data signal to produce a sequence of data values during a normal mode of operation;
for each receiver, a respective clock recovery circuit to generate a respective recovered clock from the respective data signal for use by the receiver in for sampling the respective serial data signal during the normal mode of operation, wherein each clock recovery circuit has a reference clock input and selection circuitry to supply as a reference clock a global reference clock during the normal mode of operation and a test clock during a test mode of operation;

circuitry for use during the test mode of operation to apply adjustments to a clock signal generated by one of said clock recovery circuits, to deterministically-vary timing of the clock signal generated by the one of said clock recovery circuits, and to responsively generate the test clock therefrom.

* * * * *